United States Patent
Thothadri et al.

(10) Patent No.: US 11,579,339 B2
(45) Date of Patent: Feb. 14, 2023

(54) REPLACEABLE COVER LENS FOR FLEXIBLE DISPLAY

(71) Applicant: Applied Materials, Inc., Santa Clara, CA (US)

(72) Inventors: Manivannan Thothadri, Mountain View, CA (US); Ali Salehpour, Saratoga, CA (US); John D. Busch, San Jose, CA (US); Robert Jan Visser, Menlo Park, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/406,992

(22) Filed: May 8, 2019

(65) Prior Publication Data

US 2019/0346591 A1 Nov. 14, 2019

Related U.S. Application Data (60) Provisional application No. 62/669,820, filed on May 10, 2018.

(51) Int. Cl.
*G02B 1/14* (2015.01)
*G02F 1/1333* (2006.01)
(Continued)

(52) U.S. Cl.
CPC ......... *G02B 1/14* (2015.01); *G02F 1/133308* (2013.01); *H01L 51/5246* (2013.01);
(Continued)

(58) Field of Classification Search
CPC ... G02B 1/14; G02B 3/0062; G02F 1/133308; G02F 1/133331; G02F 2202/28;
(Continued)

(56) References Cited

U.S. PATENT DOCUMENTS 6,512,512 B1   1/2003  Blanchard
6,660,388 B2  12/2003  Liu et al.
(Continued)

FOREIGN PATENT DOCUMENTS

CN  1446371 A  10/2003
CN  1928637 A   3/2007
(Continued)

OTHER PUBLICATIONS

International Search Report and Written Opinion dated Sep. 29, 2020 for Application No. PCT/US2020/037949.
(Continued)

*Primary Examiner* — Anthony J Frost
(74) *Attorney, Agent, or Firm* — Patterson + Sheridan, LLP (57) ABSTRACT

Implementations described herein generally relate to flexible display devices and cover lens assemblies with flexible cover lens. In one or more embodiments, a cover lens assembly is provided and includes a first flexible cover lens, a second flexible cover lens, and a sacrificial adhesion disposed between the first flexible cover lens and the second flexible cover lens. The first flexible cover lens includes a first hard coat layer having a hardness in a range from about 4H to about 9H and a first substrate. The second flexible cover lens includes a second hard coat layer having a hardness in a range from about 2H to about 9H. The first substrate is disposed between the first hard coat layer and the sacrificial adhesion layer.

26 Claims, 5 Drawing Sheets

(51) Int. Cl.
   *H01L 51/52*   (2006.01)
   *H05K 5/00*    (2006.01)
   *H05K 5/03*    (2006.01)

(52) U.S. Cl.
   CPC ............ *H05K 5/0017* (2013.01); *H05K 5/03* (2013.01); *G02F 1/133331* (2021.01); *G02F 2202/28* (2013.01); *H01L 2251/5338* (2013.01); *H01L 2251/558* (2013.01)

(58) Field of Classification Search
   CPC ......... H01L 51/5246; H01L 2251/5338; H01L 2251/558; H01L 51/5275; H01L 51/5253; H05K 5/0017; H05K 5/03
   See application file for complete search history.

(56) References Cited

U.S. PATENT DOCUMENTS

| | | |
|---|---|---|
| 6,781,642 B2 | 8/2004 | Nakanishi et al. |
| 6,841,190 B2 | 1/2005 | Liu et al. |
| 6,872,114 B2 | 3/2005 | Chung et al. |
| 7,071,927 B2 | 7/2006 | Blanchard |
| 7,326,313 B2 | 2/2008 | Lee et al. |
| 7,342,080 B2 | 3/2008 | Qiu et al. |
| 7,880,967 B2 | 2/2011 | Taketomo et al. |
| 8,580,378 B2 | 11/2013 | Noguchi |
| 8,618,531 B2 | 12/2013 | Alden et al. |
| 8,693,099 B2 | 4/2014 | Kawashima et al. |
| 9,023,162 B2 | 5/2015 | McCormick et al. |
| 9,475,947 B2 | 10/2016 | Sirois |
| 10,034,395 B2 | 7/2018 | Shin |
| 10,096,792 B2 | 10/2018 | Ahn et al. |
| 10,211,421 B2 | 2/2019 | Lee et al. |
| 10,237,989 B1 | 3/2019 | Peters et al. |
| 10,241,377 B1 | 3/2019 | Wang et al. |
| 10,545,537 B2 | 1/2020 | Ahn et al. |
| 10,566,570 B2 | 2/2020 | Bu et al. |
| 10,632,711 B2 | 4/2020 | Lee et al. |
| 10,752,808 B2 | 8/2020 | Ono |
| 2002/0114934 A1 | 8/2002 | Liu et al. |
| 2002/0122925 A1 | 9/2002 | Liu et al. |
| 2004/0121105 A1* | 6/2004 | Janssen ............... B32B 7/06 428/40.1 |
| 2005/0249944 A1 | 11/2005 | Wang et al. |
| 2006/0275950 A1 | 12/2006 | Lee |
| 2006/0278333 A1 | 12/2006 | Lee et al. |
| 2007/0196633 A1 | 8/2007 | Coak et al. |
| 2008/0047468 A1 | 2/2008 | de Rojas |
| 2008/0241524 A1 | 10/2008 | Fukuda et al. |
| 2008/0311351 A1 | 12/2008 | Hsu et al. |
| 2009/0130472 A1 | 5/2009 | Kondo et al. |
| 2009/0311539 A1 | 12/2009 | Larson-Smith et al. |
| 2010/0028608 A1* | 2/2010 | Choi ............... G02F 1/1333 428/158 |
| 2010/0118406 A1 | 5/2010 | Kobori et al. |
| 2010/0330359 A1* | 12/2010 | Ishikawa ............ C09D 133/08 428/325 |
| 2013/0122230 A1 | 5/2013 | Tsai et al. |
| 2013/0236713 A1 | 9/2013 | Park et al. |
| 2014/0147662 A1 | 5/2014 | Ishikawa et al. |
| 2014/0322471 A1 | 10/2014 | Liu et al. |
| 2014/0322472 A1 | 10/2014 | McCormick et al. |
| 2015/0125679 A1 | 5/2015 | Ishikawa |
| 2015/0167170 A1 | 6/2015 | Ranade et al. |
| 2015/0266272 A1 | 9/2015 | Lee et al. |
| 2015/0275040 A1 | 10/2015 | Shi et al. |
| 2016/0024348 A1 | 1/2016 | Kim et al. |
| 2016/0046830 A1 | 2/2016 | Kim et al. |
| 2016/0052199 A1* | 2/2016 | Hansen ............... B29C 67/202 216/55 |
| 2016/0208130 A1 | 7/2016 | Ishikawa et al. |
| 2016/0306392 A1 | 10/2016 | Park |
| 2016/0372701 A1 | 12/2016 | Kwon et al. |
| 2017/0065950 A1 | 3/2017 | Schenck et al. |
| 2017/0095993 A1* | 4/2017 | Tomomatsu ........... B32B 27/16 |
| 2017/0170416 A1* | 6/2017 | Johnson ................. B32B 27/34 |
| 2017/0183257 A1 | 6/2017 | Apitz et al. |
| 2017/0183462 A1 | 6/2017 | Song et al. |
| 2017/0217143 A1 | 8/2017 | Kim et al. |
| 2017/0253707 A1 | 9/2017 | Lim et al. |
| 2017/0276840 A1 | 9/2017 | Horio et al. |
| 2018/0196169 A1 | 7/2018 | Choi et al. |
| 2018/0264790 A1 | 9/2018 | Leatherdale et al. |
| 2018/0265731 A1 | 9/2018 | Ekinaka et al. |
| 2018/0294441 A1 | 10/2018 | Brotzman et al. |
| 2018/0346760 A1 | 12/2018 | Kim et al. |
| 2018/0372921 A1 | 12/2018 | Washio et al. |
| 2019/0086760 A1 | 3/2019 | Wang et al. |
| 2019/0131571 A1 | 5/2019 | Thothadri et al. |
| 2019/0293921 A1 | 9/2019 | Nam et al. |
| 2019/0377105 A1 | 12/2019 | Lim et al. |
| 2019/0383973 A1 | 12/2019 | Jang et al. |
| 2020/0020256 A1 | 1/2020 | Spiro et al. |
| 2020/0057178 A1 | 2/2020 | Thothadri et al. |
| 2020/0081162 A1 | 3/2020 | Park et al. |
| 2020/0095469 A1 | 3/2020 | Yu et al. |
| 2020/0123410 A1 | 4/2020 | Reit et al. |

FOREIGN PATENT DOCUMENTS

| | | |
|---|---|---|
| CN | 100549064 C | 10/2009 |
| CN | 101616964 A | 12/2009 |
| CN | 101874211 A | 10/2010 |
| CN | 103677400 A | 3/2014 |
| CN | 104765178 A | 7/2015 |
| CN | 104284776 B | 1/2016 |
| CN | 106023810 A | 10/2016 |
| CN | 106992221 A | 7/2017 |
| CN | 106992253 A | 7/2017 |
| CN | 106992254 A | 7/2017 |
| CN | 106992255 A | 7/2017 |
| CN | 107450784 A | 12/2017 |
| CN | 107452891 A | 12/2017 |
| CN | 107799574 A | 3/2018 |
| CN | 107919436 A | 4/2018 |
| CN | 108292005 A | 7/2018 |
| CN | 207817243 U | 9/2018 |
| CN | 108807463 A | 11/2018 |
| CN | 109326218 A | 2/2019 |
| CN | 109427990 A | 3/2019 |
| CN | 109642964 A | 4/2019 |
| CN | 109659332 A | 4/2019 |
| CN | 109659333 A | 4/2019 |
| CN | 109689827 A | 4/2019 |
| CN | 209102942 U | 7/2019 |
| CN | 110085138 A | 8/2019 |
| CN | 110531897 A | 12/2019 |
| CN | 110669423 A | 1/2020 |
| CN | 209890544 U | 1/2020 |
| CN | 209992964 U | 1/2020 |
| CN | 110782785 A | 2/2020 |
| CN | 110783389 A | 2/2020 |
| CN | 111051052 A | 4/2020 |
| CN | 107615103 B | 12/2020 |
| EP | 1632541 A1 | 3/2006 |
| EP | 2329888 A2 | 6/2011 |
| EP | 2981413 A1 | 2/2016 |
| EP | 2180354 B1 | 8/2017 |
| EP | 3327731 A1 | 5/2018 |
| EP | 3429845 A1 | 1/2019 |
| EP | 3417360 B1 | 9/2019 |
| EP | 3633004 A1 | 4/2020 |
| JP | 03411009 B2 | 5/2003 |
| JP | 2003266587 A | 9/2003 |
| JP | 03565929 B2 | 9/2004 |
| JP | 03615171 B2 | 1/2005 |
| JP | 2005017544 A | 1/2005 |
| JP | 2005055724 A | 3/2005 |
| JP | 2005144719 A | 6/2005 |
| JP | 2005178176 A | 7/2005 |
| JP | 2005280131 A | 10/2005 |
| JP | 03751922 B2 | 3/2006 |
| JP | 2006071982 A | 3/2006 |

(56) References Cited

FOREIGN PATENT DOCUMENTS

| | | | |
|---|---|---|---|
| JP | 2006155452 A | 6/2006 |
| JP | 03802842 B2 | 7/2006 |
| JP | 03942039 B2 | 7/2007 |
| JP | 2007216435 A | 8/2007 |
| JP | 2008110550 A | 5/2008 |
| JP | 2010515783 A | 5/2010 |
| JP | 4793056 B2 | 10/2011 |
| JP | 5201369 B2 | 6/2013 |
| JP | 2013107382 A | 6/2013 |
| JP | 05296410 B2 | 9/2013 |
| JP | 5518374 B2 | 6/2014 |
| JP | 2015003510 A | 1/2015 |
| JP | 201587625 A | 5/2015 |
| JP | 2015174270 A | 10/2015 |
| JP | 2015182272 A | 10/2015 |
| JP | 2015197487 A | 11/2015 |
| JP | 2017126620 A | 7/2017 |
| JP | 2017128136 A | 7/2017 |
| JP | 6207679 B2 | 10/2017 |
| JP | 2018109773 A | 7/2018 |
| JP | 2018159913 A | 10/2018 |
| JP | 2018180274 A | 11/2018 |
| JP | 06532929 B2 | 6/2019 |
| JP | 6542970 B2 | 7/2019 |
| JP | 6787673 B2 | 11/2020 |
| KR | 550377 B1 | 2/2006 |
| KR | 2008034534 A | 4/2008 |
| KR | 20140122385 A | 10/2014 |
| KR | 2016071174 A | 6/2016 |
| KR | 2016095308 A | 8/2016 |
| KR | 2016103681 A | 9/2016 |
| KR | 2017001102 A | 1/2017 |
| KR | 2017019840 A | 2/2017 |
| KR | 2017019865 A | 2/2017 |
| KR | 2017021033 A | 2/2017 |
| KR | 2017041368 A | 4/2017 |
| KR | 2017041369 A | 4/2017 |
| KR | 2017051909 A | 5/2017 |
| KR | 2017051911 A | 5/2017 |
| KR | 2017059158 A | 5/2017 |
| KR | 2017075663 A | 7/2017 |
| KR | 2017078159 A | 7/2017 |
| KR | 2017097381 A | 8/2017 |
| KR | 2017097401 A | 8/2017 |
| KR | 2017103395 A | 9/2017 |
| KR | 1788596 B1 | 10/2017 |
| KR | 2017136033 A | 12/2017 |
| KR | 2018001175 A | 1/2018 |
| KR | 1854524 B1 | 5/2018 |
| KR | 2018067864 A | 6/2018 |
| KR | 2018067865 A | 6/2018 |
| KR | 2018073987 A | 7/2018 |
| KR | 2018074544 A | 7/2018 |
| KR | 2018083171 A | 7/2018 |
| KR | 2018093649 A | 8/2018 |
| KR | 2018096996 A | 8/2018 |
| KR | 1938413 B1 | 1/2019 |
| KR | 1948655 B1 | 2/2019 |
| KR | 2019030912 A | 3/2019 |
| KR | 1971832 B1 | 4/2019 |
| KR | 2019039465 A | 4/2019 |
| KR | 2019039466 A | 4/2019 |
| KR | 2019043427 A | 4/2019 |
| KR | 2019043428 A | 4/2019 |
| KR | 2019044267 A | 4/2019 |
| KR | 2019044360 A | 4/2019 |
| KR | 2019060463 A | 6/2019 |
| KR | 2019081823 A | 7/2019 |
| KR | 2009962 B1 | 8/2019 |
| KR | 2017142 B1 | 9/2019 |
| KR | 2019104565 A | 9/2019 |
| KR | 2019109024 A | 9/2019 |
| KR | 2019109113 A | 9/2019 |
| KR | 2031275 B1 | 10/2019 |
| KR | 2039737 B1 | 11/2019 |
| KR | 2043333 B1 | 11/2019 |
| KR | 2047504 B1 | 11/2019 |
| KR | 2047512 B1 | 11/2019 |
| KR | 2019128557 A | 11/2019 |
| KR | 2019130490 A | 11/2019 |
| KR | 2060541 B1 | 12/2019 |
| KR | 2076281 B1 | 2/2020 |
| KR | 2020021406 A | 2/2020 |
| KR | 2020021407 A | 2/2020 |
| KR | 2088674 B1 | 3/2020 |
| KR | 2020022168 A | 3/2020 |
| KR | 2020025036 A | 3/2020 |
| KR | 2020025472 A | 3/2020 |
| KR | 2020030663 A | 3/2020 |
| KR | 2020041042 A | 4/2020 |
| TW | 201441048 A | 11/2014 |
| TW | 201500433 A | 1/2015 |
| TW | 201508827 A | 3/2015 |
| TW | 201525081 A | 7/2015 |
| TW | 201729996 A | 9/2017 |
| TW | 201838815 A | 11/2018 |
| TW | 201922478 A | 6/2019 |
| WO | 2009041533 A1 | 4/2009 |
| WO | 2014141866 A1 | 9/2014 |
| WO | 2016208785 A1 | 12/2016 |
| WO | 2017073903 A1 | 5/2017 |
| WO | 2017116103 A1 | 7/2017 |
| WO | 2018070523 A1 | 4/2018 |
| WO | 2018130289 A1 | 7/2018 |
| WO | 2018159918 A1 | 9/2018 |
| WO | 2018186262 A1 | 10/2018 |
| WO | 2018230495 A1 | 12/2018 |
| WO | 2019083606 A1 | 5/2019 |
| WO | 2019085486 A1 | 5/2019 |
| WO | 2019147915 A1 | 8/2019 |
| WO | 2019168005 A1 | 9/2019 |
| WO | 2019217565 A1 | 11/2019 |
| WO | 2019237254 A1 | 12/2019 |

OTHER PUBLICATIONS

International Search Report and Written Opinion dated Sep. 29, 2020 for Application No. PCT/US2020/037952.
International Search Report and Written Opinion dated Sep. 29, 2020 for Application No. PCT/US2020/037956.
International Search Report and Written Opinion dated Sep. 29, 2020 for Application No. PCT/US2020/037958.
International Search Report and Written Opinion dated Aug. 28, 2019 for Application No. PCT/US2019/031337.
International Search Report and the Written Opinion for International Application No. PCT/US2019/040402 dated Oct. 18, 2019.
Taiwanese Office Action and Search Report for TW Application No. 108123820 dated Jul. 30, 2020.
Taiwan Office Action dated Aug. 27, 2020 for Application No. 108116194.
PCT International Search Report/Written Opinion dated Dec. 12, 2018 for Application No. PCT/US2018/048391.
Day-Shan Liu et al: "Adhesion enhancement of hard coatings deposited on flexible plastic substrates using an interfacial buffer layer", Journal of Physics D: Applied Physics, Institute of Physics Publishing LTD, GB, vol. 43, No. 17, May 5, 2010 (May 5, 2019), p. 175301, XP020171087, ISSN: 0022-3727 Experiment; table 1.
Kuhr M et al: "Coatings on plastics with the PICVD technology", Thin Solid F, Elsevier, Amsterdam, NL, vol. 442, No. 1-2, Sep. 17, 2003 (Sep. 17, 2003), pp. 107-116, XP004458307, ISSN: 0040-6090, DOI: 10.1016/S0040-6090(03)00956-8 Experimental.
Taiwan Office Action dated Sep. 3, 2021 for Application No. 107130254.
Chinese Office Action dated Sep. 3, 2021 for Application No. 201980029310.7.
Japanese Office Action dated Mar. 30, 2021 for Application No. 2020-522838.
Anonymous: "The Pencil Hardness Test", Dec. 4, 2016, XP055818807, http://web.archive.org/web/20161204152411/http://www.pencilpages.com/articles/simmons.htm, p. 2.

(56) References Cited

OTHER PUBLICATIONS

Extended European Search Report dated Jul. 8, 2021 for Application No. 18871752.4.
Taiwan Office Action dated Jul. 20, 2021 for Application No. 109120632.
Japanese Office Action dated Jan. 4, 2022 for Application No. 2020-563552.
Korean Office Action dated Jun. 22, 2022 for Application No. 10-2020-7035352.
Chinese Office Action dated Mar. 2, 2022 for Application No. 201880069545.4.
Japanese Office Action dated Mar. 15, 2022 for Application No. 2020-522838.
Chinese Office Action dated Apr. 27, 2022 for Application No. 201980029310.7.
Japanese Office Action dated Aug. 2, 2022 for Application No. 2020-563552.
Chinese Office Action dated Oct. 18, 2022 for Application No. 201980029310.7.
Korean Office Action dated Dec. 19, 2022 for Application No. 10-2020-7035352.

\* cited by examiner

REPLACEABLE COVER LENS FOR FLEXIBLE DISPLAY

CROSS-REFERENCE TO RELATED APPLICATIONS

Field

This application claims benefit to U.S. Appl. No. 62/669,820, filed on May 10, 2018, which is herein incorporated by reference.

BACKGROUND

Field

Implementations described herein generally relate to flexible display devices, and more specifically to flexible cover lens.

Description of the Related Art

Electronic devices often have displays such as liquid crystal displays (LCDs) and organic light emitting-diode (OLED) displays. Such displays can be fragile and sensitive to moisture, pressure, or particle contamination. Generally, display devices use several layers of optical devices to colorize, polarize, and shutter light from an illumination source. To prevent damage to the underlying film, a rigid display cover lens layer is mounted over the other layers to prevent damage to the underlying layers. The inclusion of the rigid display cover lens can add undesirable weight to an electronic device. The cover lens can be omitted to reduce the size and weight of a device, but omitting the cover lens can make the display susceptible to damage from scratches.

An increasing demand for new functionalities of products and exploiting new and broad applications calls for thinner and lighter lens substrates with new properties such as flexibility. Broadly, three main characteristics are desired from a cover lens for these new flexible or foldable displays: 1) optical performance, 2) high hardness, and 3) flexibility. Good optical performance ensures good transmission of light with very little haze. High hardness relates to scratch and abrasion resistance. Flexibility in cover lenses is in terms of having a high enough critical strain that failure due to crack or delamination is avoided when repeatedly bent and folded.

Traditionally, while cover lenses have been excellent at addressing the first two characteristics (e.g., optical performance and hardness), they have been poor at the third characteristic, e.g., flexibility, due to their brittle nature. To improve flexibility, significant prior effort has gone into increasing the critical-strain at failure for glass, mainly by reducing the thickness of glass or chemical modification of the materials. Nonetheless, glass as a material for cover lens has been found such that when the glass fails the entire cover has to be replaced. Alternate solutions for cover lenses may bring excellent optical performance and flexibility but are typically vulnerable to abrasion and or scratches. Once damaged by scratches, the entire cover has to be replaced. Replacing the cover lens requires specific expertise, time, and is done at a great expense.

Therefore, there is a need for a cover lens that is both flexible and can easily be replaced.

SUMMARY

Implementations described herein generally relate to flexible display devices. In one or more embodiments, a cover lens assembly is provided and includes a first flexible cover lens, a second flexible cover lens, and a sacrificial adhesion disposed between the first flexible cover lens and the second flexible cover lens. The first flexible cover lens includes a first hard coat layer having a hardness in a range from about 4 H to about 9 H and a first substrate. The second flexible cover lens includes a second hard coat layer having a hardness in a range from about 2 H to about 9 H. The first substrate is disposed between the first hard coat layer and the sacrificial adhesion layer.

In some embodiments, a cover lens assembly is provided and includes a first flexible cover lens, a second flexible cover lens, and a sacrificial adhesion disposed between the first flexible cover lens and the second flexible cover lens. The first flexible cover lens includes a first hard coat layer having a hardness in a range from about 4 H to about 9 H, a first impact absorption layer, and a first substrate disposed between the first hard coat layer and the first impact absorption layer. The second flexible cover lens includes a second hard coat layer having a hardness in a range from about 2 H to about 9 H, a second impact absorption layer, and a second substrate disposed between the second hard coat layer and the second impact absorption layer.

In other embodiments, a cover lens assembly is provided and includes a flexible cover lens and a sacrificial adhesion layer. The flexible cover lens includes a hard coat layer having a hardness in a range from about 4 H to about 9 H and a thickness in a range from about 0.1 µm to about 40 µm, and a substrate having a thickness in a range from about 5 µm to about 200 µm. The sacrificial adhesion layer is disposed on a lower surface of the cover lens.

In one or more embodiments, a display device is provided and includes a first flexible cover lens, a second flexible cover lens, and a sacrificial adhesion, a display structure, and an adhesive layer. The first flexible cover lens includes a first hard coat layer having a hardness in a range from about 4 H to about 9 H and a first substrate. The second flexible cover lens includes a second hard coat layer having a hardness in a range from about 2 H to about 9 H. The sacrificial adhesion layer is disposed between the first flexible cover lens and the second flexible cover lens, wherein the first substrate is disposed between the first hard coat layer and the sacrificial adhesion layer. The adhesive layer is disposed between the second flexible cover lens and the display structure, where the sacrificial adhesion layer has a different composition than the adhesive layer.

In some embodiments, a display device is provided and includes a first flexible cover lens, a second flexible cover lens, and a sacrificial adhesion, a display structure, and an adhesive layer. The first flexible cover lens includes a first hard coat layer having a hardness in a range from about 4 H to about 9 H, a first impact absorption layer, and a first substrate disposed between the first hard coat layer and the first impact absorption layer. The second flexible cover lens includes a second hard coat layer having a hardness in a range from about 2 H to about 9 H, a second impact absorption layer, and a second substrate disposed between the second hard coat layer and the second impact absorption layer. The sacrificial adhesion layer is disposed between the first flexible cover lens and the second flexible cover lens. The adhesive layer is disposed between the second flexible cover lens and the display structure, where the sacrificial adhesion layer has a different composition than the adhesive layer.

BRIEF DESCRIPTION OF THE DRAWINGS

So that the manner in which the above recited features of the disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of scope, for the disclosure may admit to other equally effective implementations.

To facilitate understanding, identical reference numerals have been used, where possible, to designate identical elements that are common to the Figures. It is contemplated that elements and features of one implementation may be beneficially incorporated in other implementations without further recitation.

DETAILED DESCRIPTION

Implementations described herein generally relate to flexible display devices, and more specifically to cover lens assemblies containing flexible cover lens with multi-layer film stacks.

Figure 1:
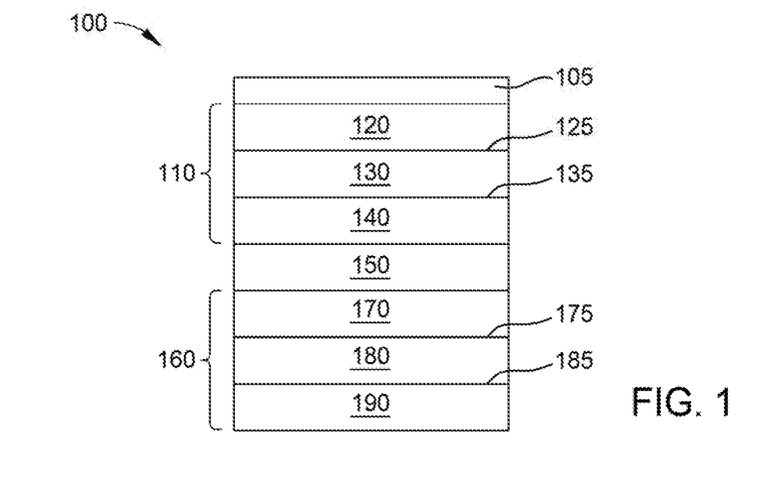
FIG. 1 depicts a schematic, cross-sectional view of a cover lens assembly according to one or more embodiments described herein.

FIG. 1 depicts a schematic, cross-sectional view of a cover lens assembly 100, according to one or more embodiments described herein. The cover lens assembly 100 includes a first flexible cover lens 110, a second flexible cover lens 160, and a sacrificial adhesion layer 150 disposed between the first flexible cover lens 110 and the second flexible cover lens 160. An upper protective film 105 is disposed on top of the first flexible cover lens 110, though it is to be understood that the upper protective film 105 is optional and may be omitted from the cover lens assembly 100. The upper protective film 105 can be or include one or more layers, such as one or more anti-reflective layers, one or more anti-fingerprint layers, or a combination thereof.

The first flexible cover lens 110 includes a first hard coat layer 120, a first substrate 130, and a first impact absorption layer 140. In one or more embodiments, the first substrate 130 is disposed between and adhered to the first hard coat layer 120 and the first impact absorption layer 140, as depicted in FIG. 1. The second flexible cover lens 160 includes a second hard coat layer 170, a second substrate 180, and a second impact absorption layer 190. In one or more embodiments, the second substrate 180 is disposed between and adhered to the second hard coat layer 170 and the second impact absorption layer 190, as depicted in FIG. 1. In one or more examples, the sacrificial adhesion layer 150 is disposed between the first impact absorption layer 140 of the first flexible cover lens 110 and the second hard coat layer 170 of the second flexible cover lens 160.

In one or more embodiments, if it is desirable to remove and replace the first flexible cover lens 110 (e.g., due to being scratched or suffering other damage), the sacrificial adhesion layer 150 can be selectively degraded, destroyed, or otherwise removed in order to separate the first flexible cover lens 110 from the second flexible cover lens 160 or other display structure. The first flexible cover lens 110 can be separated from the second flexible cover lens 160 by exposing the sacrificial adhesion layer 150 to a predetermined temperature, a predetermined wavelength and/or dosage of ultraviolet (UV) light, and/or a predetermined mechanical removal mechanism, as further discussed and described below.

Each of the first hard coat layer 120 and the second hard coat layer 170 can independently include one or more materials selected from silicon oxides, silicon nitrides, silicon oxynitrides, radiation curable acrylates, aliphatic urethane acrylates, copolymer thereof, elastomer thereof, and any combination thereof. In one or more examples, the first hard coat layer 120 and/or the second hard coat layer 170 can be deposited coated, or otherwise formed by a vacuum processing, atmospheric processing, solution processing, or other deposition or coating techniques, and then optionally treated or cured with a thermal and/or UV exposure.

The first hard coat layer 120 can have a hardness of about 2 H, about 3 H, about 4 H, about 5 H, or about 6 H to about 7 H, about 8 H, or about 9 H, based on the pencil hardness scale. For example, the first hard coat layer 120 can have a hardness of about 2 H to about 9 H, about 3 H to about 9 H, about 4 H to about 9 H, about 5 H to about 9 H, about 6 H to about 9 H, about 7 H to about 9 H, about 2 H to about 8 H, about 3 H to about 8 H, about 4 H to about 8 H, about 5 H to about 8 H, about 6 H to about 8 H, about 7 H to about 8 H, about 2 H to about 7 H, about 3 H to about 7 H, about 4 H to about 7 H, about 5 H to about 7 H, about 6 H to about 7 H, about 6 H to about 9 H, about 7 H to about 9 H, about 8 H to about 9 H, about 6 H to about 8 H, or about 7 H to about 8 H, based on the pencil hardness scale. The second hard coat layer 170 can have a hardness of about 2 H, about 3 H, about 4 H, or about 5 H to about 6 H, about 7 H, about 8 H, or about 9 H, based on the pencil hardness scale. For example, the second hard coat layer 170 can have a hardness of about 2 H to about 9 H, about 3 H to about 9 H, about 4 H to about 9 H, about 5 H to about 9 H, about 6 H to about 9 H, about 7 H to about 9 H, about 2 H to about 7 H, about 3 H to about 7 H, or about 5 H to about 7 H, based on the pencil hardness scale.

Each of the first hard coat layer 120 and the second hard coat layer 170 can independently have a thickness of about 0.1 μm, about 0.2 μm, about 0.5 μm, about 0.6 μm, about 0.8 μm, about 1 μm, about 1.2 μm, about 1.5 μm, about 1.8 μm, about 2 μm, about 3 μm, about 5 μm, about 10 μm, about 15 μm, or about 20 μm to about 25 μm, about 30 μm, about 35 μm, about 40 μm, about 50 μm, or thicker. For example, each of the first hard coat layer 120 and the second hard coat layer 170 can independently have a thickness of about 0.1 μm to about 50 µm, about 0.1 µm to about 40 µm, about 0.1 µm to about 35 µm, about 0.1 µm to about 30 µm, about 0.1 µm to about 25 µm, about 0.1 µm to about 20 µm, about 0.1 µm to about 15 µm, about 0.1 µm to about 10 µm, about 0.1 µm to about 5 µm, about 0.1 µm to about 2 µm, about 0.1 µm to about 1 µm, about 0.5 µm to about 50 µm, about 0.5 µm to about 40 µm, about 0.5 µm to about 35 µm, about 0.5 µm to about 30 µm, about 0.5 µm to about 25 µm, about 0.5 µm to about 20 µm, about 0.5 µm to about 10 µm, about 0.5 µm to about 5 µm, about 0.5 µm to about 2 µm, about 1 µm to about 50 µm, about 1 µm to about 40 µm, about 1 µm to about 35 µm, about 1 µm to about 30 µm, about 1 µm to about 25 µm, about 1 µm to about 20 µm, about 1 µm to about 10 µm, about 1 µm to about 5 µm, about 1 µm to about 3 µm, about 5 µm to about 50 µm, about 5 µm to about 40 µm, about 5 µm to about 35 µm, about 5 µm to about 30 µm, about 5 µm to about 25 µm, about 5 µm to about 20 µm, about 10 µm to about 50 µm, about 10 µm to about 40 µm, about 10 µm to about 35 µm, about 10 µm to about 30 µm, about 10 µm to about 25 µm, or about 10 µm to about 20 µm.

The first and second hard coat layers 120 and 170 can independently be applied to the underlying surface by using various processes, such as by using Mayer rods, and then heated in a non-active convection at a temperature of about 75° C. to about 85° C. for about 100 seconds to about 140 seconds. Also, the first and second hard coat layers 120 and 170 can independently be irradiated with a UV lamp at a power of about 300 mJ/cm$^2$ to about 700 mJ/cm$^2$ for about 100 seconds to about 140 seconds. The first and second hard coat layers 120 and 170 can independently be slot die coated or cast.

In some examples, the first and second hard coat layers 120 and 170 can independently be deposited or otherwise formed on an underlying surface by using one or more techniques or process, such as chemical vapor deposition (CVD), plasma-enhanced CVD (PE-CVD), atomic layer deposition (ALD), plasma-enhanced ALD (PE-ALD), physical vapor deposition (PVD) or sputtering, or other vacuum or vapor deposition processes. The deposition processes can be thermal processes or plasma processes which can include exposure by an ion beam or an electron beam. The first and second hard coat layers 120 and 170 can independently be deposited or otherwise formed at a process temperature of about 50° C. to about 350° C., about 70° C. to about 300° C., or about 100° C. to about 250° C.

The first and second hard coat layers 120 and 170 can independently have a bending inside radius of about 1 mm to about 5 mm, a bending outside radius of about 5 mm to about 20 mm, a transmittance of about 85% to about 98%, about 88% to about 95%, or about 90% to about 92%, and a thermal resistance of about −20° C. to about 80° C. In one or more examples, the first and second hard coat layers 120 and 170 can independently be cured using ultraviolet radiation, an electron-beam process and/or vacuum deposition process with plasma. The first impact absorption layer 140 and the second impact absorption layer 190 can independently have a transmission of about 90% to about 99.99% ASTM D1003, a haze of less than 1% ASTM D10003, a sandpaper abrasion of less than 0.5% ASTM D1044, and an Erichsen pen scratch of greater than 18N Bosch.

Each of the first impact absorption layer 140 and the second impact absorption layer 190 can independently include one or more materials selected from ether urethanes, ester urethanes, aliphatic urethanes, aliphatic polyurethanes, aliphatic polyester urethanes, polysulfide thermosets, copolymers thereof, elastomers thereof, and any combination thereof. Each of the first impact absorption layer 140 and the second impact absorption layer 190 can independently have a thickness of about 3 µm, about 5 µm, about 10 µm, about 20 µm, about 30 µm, or 40 µm to about 50 µm, about 60 µm, about 80 µm, about 100 µm, about 110 µm, about 120 µm, about 130 µm, about 150 µm, or thicker. For example, each of the first impact absorption layer 140 and the second impact absorption layer 190 can independently have a thickness of about 5 µm to about 150 µm, about 5 µm to about 130 µm, about 5 µm to about 120 µm, about 5 µm to about 100 µm, about 5 µm to about 80 µm, about 10 µm to about 150 µm, about 10 µm to about 130 µm, about 10 µm to about 120 µm, about 10 µm to about 100 µm, or about 10 µm to about 80 µm.

In one or more examples, the first impact absorption layer 140 and the second impact absorption layer 190 can independently include an elastomer layer with a thickness of less than 100 µm, such as about 75 µm or less. In some examples, the first impact absorption layer 140 and the second impact absorption layer 190 can independently be slot die coated or cast.

Each of the first substrate 130 and the second substrate 180 can independently include one or more materials selected from polyethelyne terephthalates, triacetylcelluloses, polycarbonates, polyamides, polyimides, (e.g., a colorless polyimide and/or a clear polyimide), a polysulfide thermoset, copolymers thereof, elastomers thereof, or any combination thereof. In one or more examples, each of the first substrate 130 and the second substrate 180 can independently include a colorless, transparent polyimide. Each of the first substrate 130 and the second substrate 180 can independently have a thickness of about 3 µm, about 5 µm, about 10 µm, about 20 µm, about 30 µm, about 50 µm, or about 60 µm to about 80 µm, about 100 µm, about 125 µm, about 150 µm, about 175 µm, about 200 µm, or thicker. For example, each of the first substrate 130 and the second substrate 180 can independently have a thickness of about 5 µm to about 200 µm, about 5 µm to about 175 µm, about 5 µm to about 150 µm, about 5 µm to about 125 µm, about 5 µm to about 100 µm, about 10 µm to about 200 µm, about 10 µm to about 175 µm, about 10 µm to about 150 µm, about 10 µm to about 125 µm, about 10 µm to about 100 µm, about 20 µm to about 200 µm, about 20 µm to about 175 µm, about 20 µm to about 150 µm, about 20 µm to about 125 µm, or about 20 µm to about 100 µm.

Each of the components of the first flexible cover lens 110 and the second flexible cover lens 160 can independently be adhered, bonded, or otherwise held together by one or more adhesives. For example, the first hard coat layer 120 and the first substrate 130 are bonded together by an adhesive layer 125 disposed therebetween and the first substrate 130 and the first impact absorption layer 140 are bonded together by an adhesive layer 135 disposed therebetween. Also, the second hard coat layer 170 and the second substrate 180 are bonded together by an adhesive layer 175 disposed therebetween and the second substrate 180 and the second impact absorption layer 190 are bonded together by an adhesive layer 185 disposed therebetween.

Each of the adhesive layers 125, 135, 175, 185 can independently be or include one or more optically clear adhesives (OCAs). In one or more examples, each of the adhesive layers 125, 135, 175, 185 is applied as a liquid-based adhesive which dries and bonds the two adjacent surfaces together. In some examples, each of the adhesive layers 125, 135, 175, 185 is OCA two-sided tape that bonds the two adjacent surfaces together.

In other embodiments, each of the components of the first flexible cover lens 110 and the second flexible cover lens 160 can independently be adhered, bonded, or otherwise held together without the use of an adhesive. As such, any or all of the adhesive layers 125, 135, 175, 185 may be excluded and the neighboring components or layers are held together with inherent bonding forces. For example, the first hard coat layer 120 is deposited or otherwise formed directly onto the first substrate 130 and no adhesive layer 125 is at the interface therebetween. Also, the first impact absorption layer 140 can be deposited or otherwise formed directly onto the first substrate 130 and no adhesive layer 135 is at the interface therebetween. Similarly, the second hard coat layer 170 is deposited or otherwise formed directly onto the second substrate 180 and no adhesive layer 175 is at the interface therebetween. Also, the second impact absorption layer 190 can be deposited or otherwise formed directly onto the second substrate 180 and no adhesive layer 185 is at the interface therebetween.

The sacrificial adhesion layer 150 includes one or more OCAs. The sacrificial adhesion layer 150 can be or include one or more polymeric or oligomeric materials, such as one or more acrylates, silicones, thermoplastic adhesives, elastomeric adhesives, or any combination thereof. The sacrificial adhesion layer 150 provides a low shear modulus and allows the layer on top of the sacrificial adhesion layer 150 to shear or slip relative to the layer below the sacrificial adhesion layer 150. In one or more examples, the sacrificial adhesion layer 150 can be formed from a liquid optically clear adhesive (LOCA) that can be dispensed in various ways and cured by UV exposure, or be heat, moisture, and/or pressure sensitive and be cured by adjusting or controlling the same. In some examples, the sacrificial adhesion layer 150 is degradable at a predetermined temperature. For examples the sacrificial adhesion layer 150 can be degradable a temperature of about 40° C., about 50° C., or about 60° C. to about 80° C., about 100° C., or about 120° C. In other examples, the sacrificial adhesion layer 150 is degradable when exposed to UV light at predetermined wavelength and/or predetermined dosage. For example, the sacrificial adhesion layer 150 is degradable when exposed to UV light having a wavelength of about 350 nm to about 375 nm, such as about 365 nm. The sacrificial adhesion layer 150 can be degraded by exposing the adhesive to the UV light for a period of about 0.5 seconds, about 1 second, or about 5 seconds to about 30 seconds, about 60 seconds, or about 90 seconds.

The sacrificial adhesion layer 150 contains an adhesive that is different than the adhesive in the adhesive layers 125, 135, 175, 185. The adhesive in the sacrificial adhesion layer 150 can have a different composition than the adhesive in the adhesive layers 125, 135, 175, 185. The adhesive in the sacrificial adhesion layer 150 is degraded or destroyed when exposed to a predetermined temperature or wavelength of UV light. As such, the adhesion or bond between the first impact absorption layer 140 of the first flexible cover lens 110 and the second hard coat layer 170 of the second flexible cover lens 160 is broken and the first flexible cover lens 110 and the second flexible cover lens 160 can be separated from each other. During same time period, the adhesive in the adhesive layers 125, 135, 175, 185 is not degraded or destroyed when exposed to the same predetermined temperature or wavelength of UV light and the adhesion or bonding between the components within the first flexible cover lens 110 and the second flexible cover lens 160 are preserved.

In one or more examples, the first flexible cover lens 110 and the second flexible cover lens 160 can independently have flexibility over repeated cycles to bend to as low as 1 mm inside radius of curvature or as low as 4 mm outside radius of curvature. In some embodiments, during bend operations of the display device containing the cover lens assembly 100, the first flexible cover lens 110 can independently move relative to the second flexible cover lens 160 by slipping, shearing, and/or sliding mechanism provided by the sacrificial adhesion layer 150. Such a slip, shear and/or slide plane that separates the first flexible cover lens 110 and the second cover lens 160 may be engineered in the material of the sacrificial adhesion layer 150. The first flexible cover lens 110 and the second flexible cover lens 160 can independently have an impact resistance, with or without the impact absorption layers, as measured by a standard ball drop test, showing an ability to withhold up to 130 g steel ball dropped from a 100 cm height, and in some examples, a height of greater than 100 cm, such as 120 cm to about 150 cm. In some example, the first flexible cover lens 110 and the second flexible cover lens 160 can independently have a scratch resistance as measured by a standard steel wool test loaded up to 1 kg and able to withstand a large number of cycles, for example, about 100 cycles to about 4,000 cycles. The first flexible cover lens 110 and the second flexible cover lens 160 can independently have a total transmission of about 85% to about 95%, a haze of less than 1%, a yellow index of $B^*<1$, and a high fracture toughness.

In some embodiments, not shown in the Figures, the first hard coat layer 120 is disposed between and adhered to the first substrate 130 and the first impact absorption layer 140, or alternatively, the first impact absorption layer 140 is disposed between and adhered to the first hard coat layer 120 and the first substrate 130. Similarly, in other embodiments, not shown, the second hard coat layer 170 is disposed between and adhered to the second substrate 180 and the second impact absorption layer 190, or alternatively, the second impact absorption layer 190 is disposed between and adhered to the second hard coat layer 170 and the second substrate 180.

In some aspects, not shown, the first flexible cover lens 110 includes any one or two of the first hard coat layer 120, the first substrate 130, and the first impact absorption layer 140, and also omits any one or two of the first hard coat layer 120, the first substrate 130, and the first impact absorption layer 140. For example, the first flexible cover lens 110 includes the first hard coat layer 120 and the first substrate 130, but excludes the first impact absorption layer 140. In other aspects, not shown, the second flexible cover lens 160 includes any one or two of the second hard coat layer 170, the second substrate 180, and the second impact absorption layer 190, and also omits any one or two of the second hard coat layer 170, the second substrate 180, and the second impact absorption layer 190. For example, the second flexible cover lens 160 includes the second substrate 180 and the second impact absorption layer 190, but excludes the second hard coat layer 170. In another example, the second flexible cover lens 160 includes the second hard coat layer 170 and the second substrate 180, but excludes the second impact absorption layer 190.

Figure 2:
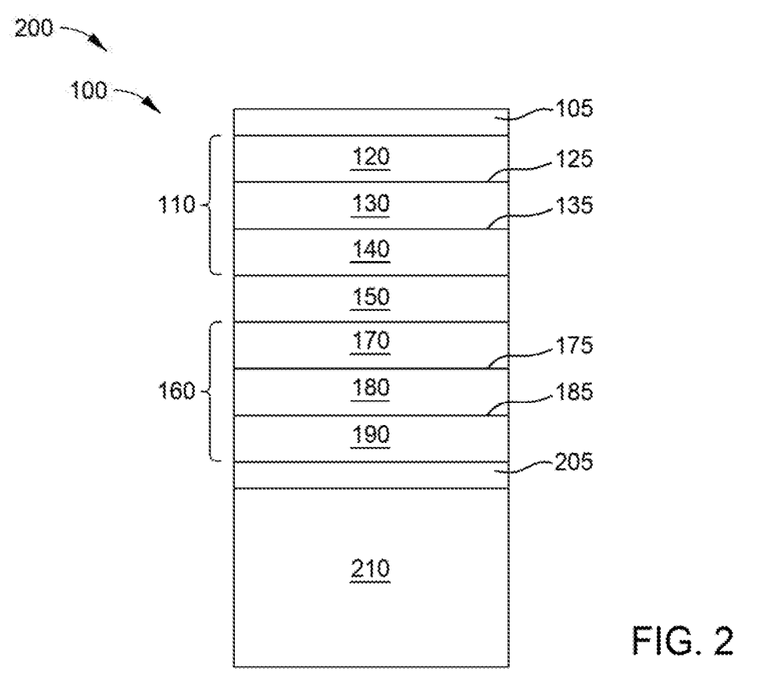
FIG. 2 depicts a schematic, cross-sectional view of a display device according to one or more embodiments described herein.

FIG. 2 depicts a schematic, cross-sectional view of a display device 200 according to one or more embodiments described herein. The display device 200 includes the first flexible cover lens 110, the second flexible cover lens 160, the sacrificial adhesion layer 150 disposed therebetween, a display structure 210, and an adhesive layer 205 disposed between the second flexible cover lens 160 and the display structure 210. The sacrificial adhesion layer 150 has a different composition than the adhesive layer 205. The first flexible cover lens 110 includes the first hard coat layer 120, the first impact absorption layer 140, and the first substrate 130 disposed between the first hard coat layer 120 and the first impact absorption layer 140. The second flexible cover lens 160 includes the second hard coat layer 170, the second impact absorption layer 190, and the second substrate 180 disposed between the second hard coat layer 170 and the second impact absorption layer 190.

The display structure 210 can be or include one or more light emitting diode (LED) displays, one or more organic light emitting diode (OLED) displays, one or more liquid crystal displays (LCDs), as well as other type of displays. In one or more embodiments, the second flexible cover lens 160 is supplemental addition bonded to the display structure 210, as depicted in FIG. 2. However, in other embodiments, not shown in the Figures, the second flexible cover lens 160 can be incorporated as a portion of the display structure 210. The adhesive layer 205 can be or include any of the adhesives used in the adhesive layers 125, 135, 175, 185. As such, the adhesive in the adhesive layer 205 is not degraded or destroyed when exposed to the same predetermined temperature or wavelength of UV light as is the adhesive in the sacrificial adhesion layer 150. In one or more configurations, the display structure 210 is adhered to the second flexible cover lens 160 by the adhesive layer 205. For example, the adhesive layer 205 is disposed between the second impact absorption layer 190 of the second flexible cover lens 160 and the polarizer layer 220 of the display structure 210.

Figure 3:
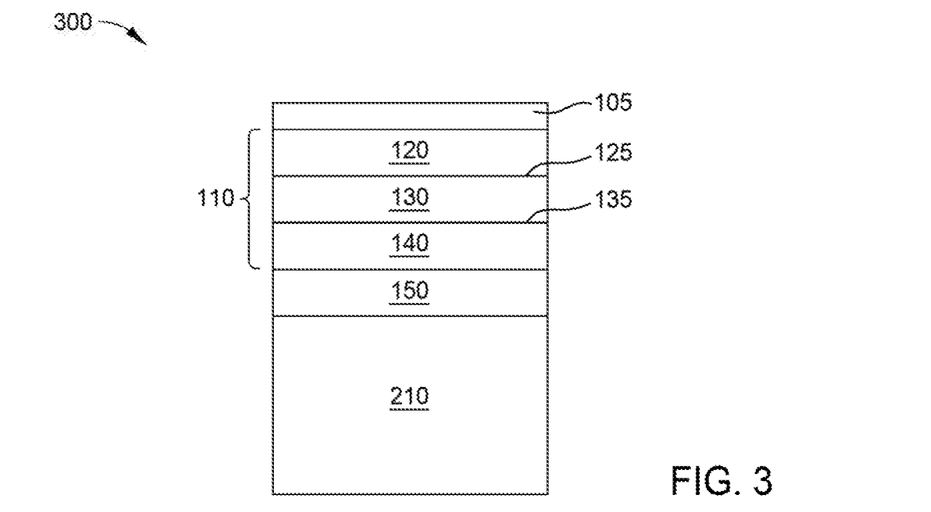
FIG. 3 depicts a schematic, cross-sectional view of another display device according to one or more embodiments described herein.

FIG. 3 depicts a schematic, cross-sectional view of a display device 300 according to one or more embodiments described herein. The display device 300 includes the upper protective film 105 disposed on top of the first flexible cover lens 110 that is adhered to the display structure 210 by the sacrificial adhesion layer 150 disposed therebetween. In one or more configurations, the sacrificial adhesion layer 150 is disposed between a lower surface or layer of the first flexible cover lens 110, such as the first impact absorption layer 140, and the display structure 210. In other configurations, not shown, if the first hard coat layer 120 or the first substrate 130 is the lower surface or layer of the first flexible cover lens 110, then the sacrificial adhesion layer 150 is coupled to and between either the first hard coat layer 120 or the first substrate 130 and the display structure 210.

Figure 4:
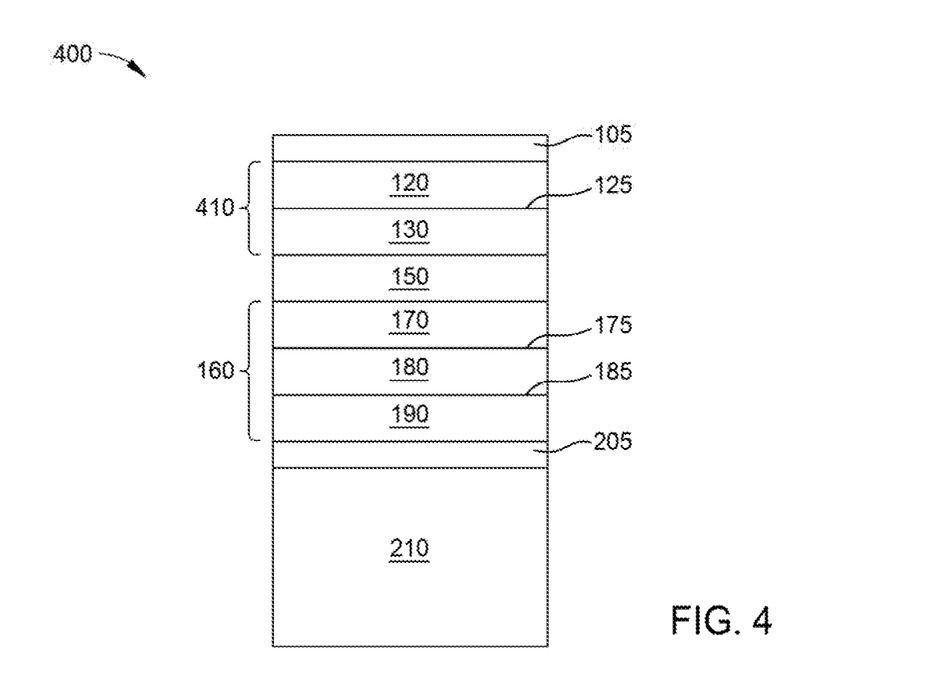
FIG. 4 depicts a schematic, cross-sectional view of another display device according to one or more embodiments described herein.

FIG. 4 depicts a schematic, cross-sectional view of a display device 400, according to one or more embodiments described and discussed herein. The display device 400 includes a first flexible cover lens 410, the second flexible cover lens 160, and the sacrificial adhesion layer 150 disposed between the first flexible cover lens 410 and the second flexible cover lens 160. The upper protective film 105 is disposed on top of the first flexible cover lens 410, though it is to be understood that the upper protective film 105 is optional and may be omitted from the display device 400.

The first flexible cover lens 410 includes the first hard coat layer 120 and the first substrate 130, as depicted in FIG. 4. The second flexible cover lens 160 includes the second hard coat layer 170, the second substrate 180, and the second impact absorption layer 190. In one or more embodiments, the second substrate 180 is disposed between and adhered to the second hard coat layer 170 and the second impact absorption layer 190. In one or more examples, the sacrificial adhesion layer 150 is disposed between the first substrate 130 of the first flexible cover lens 410 and the second hard coat layer 170 of the second flexible cover lens 160. The display device 400 also includes the adhesive layer 205 disposed between the second impact absorption layer 190 of the second flexible cover lens 160 and the display structure 210.

In some embodiments, the first hard coat layer 120 and the first substrate 130 are bonded together by the adhesive layer 125 disposed therebetween, the second hard coat layer 170 and the second substrate 180 are bonded together by the adhesive layer 175 disposed therebetween, and/or the second substrate 180 and the second impact absorption layer 190 are bonded together by the adhesive layer 185 disposed therebetween. Alternatively, in one or more embodiments, each of the components of the first flexible cover lens 410 and the second flexible cover lens 160 can independently be adhered, bonded, or otherwise held together without the use of an adhesive. As such, any or all of the adhesive layers 125, 175, and 185 may be excluded and the neighboring components or layers are held together with inherent bonding forces.

Figure 5:
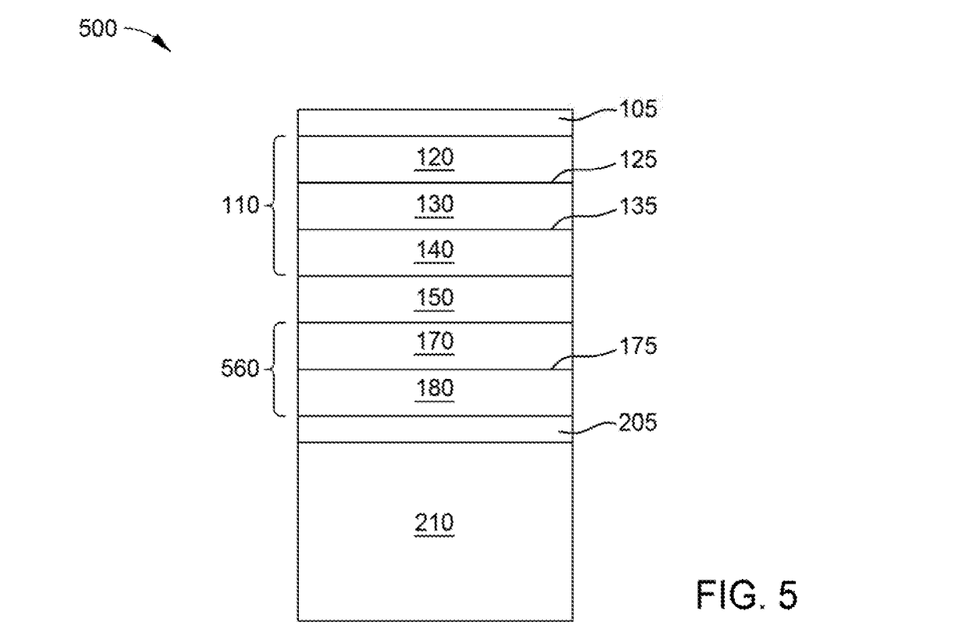
FIG. 5 depicts a schematic, cross-sectional view of another display device according to one or more embodiments described herein.

FIG. 5 depicts a schematic, cross-sectional view of a display device 500, according to one or more embodiments described and discussed herein. The display device 500 includes the first flexible cover lens 110, a second flexible cover lens 560, and the sacrificial adhesion layer 150 disposed between the first flexible cover lens 110 and the second flexible cover lens 560. The upper protective film 105 is disposed on top of the first flexible cover lens 110, though it is to be understood that the upper protective film 105 is optional and may be omitted from the display device 500.

The first flexible cover lens 110 includes the first hard coat layer 120, the first substrate 130, and the first impact absorption layer 140. In one or more embodiments, the first substrate 130 is disposed between and adhered to the first hard coat layer 120 and the first impact absorption layer 140. The second flexible cover lens 560 includes the second hard coat layer 170 and the second substrate 180. In one or more examples, the sacrificial adhesion layer 150 is disposed between the first impact absorption layer 140 of the first flexible cover lens 110 and the second hard coat layer 170 of the second flexible cover lens 560. The display device 500 also includes the adhesive layer 205 disposed between the display structure 210 and the second substrate 180 of the second flexible cover lens 560.

In some embodiments, the first hard coat layer 120 and the first substrate 130 are bonded together by the adhesive layer 125 disposed therebetween, the first substrate 130 and the first impact absorption layer 140 are bonded together by the adhesive layer 135 disposed therebetween, and/or the second hard coat layer 170 and the second substrate 180 are bonded together by the adhesive layer 175 disposed therebetween. Alternatively, in one or more embodiments, each of the components of the first flexible cover lens 110 and the second flexible cover lens 560 can independently be adhered, bonded, or otherwise held together without the use of an adhesive. As such, any or all of the adhesive layers 125, 135, and 175 may be excluded and the neighboring components or layers are held together with inherent bonding forces.

Figure 6:
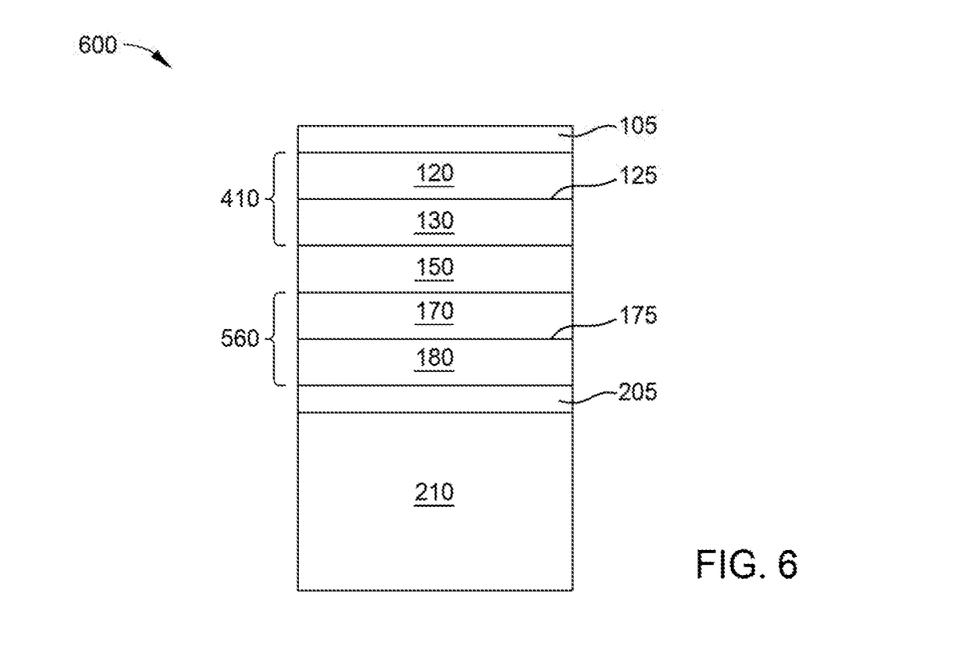
FIG. 6 depicts a schematic, cross-sectional view of another display device according to one or more embodiments described herein.

FIG. 6 depicts a schematic, cross-sectional view of a display device 600, according to one or more embodiments described and discussed herein. The display device 600 includes the first flexible cover lens 410, the second flexible cover lens 560, and the sacrificial adhesion layer 150 disposed between the first flexible cover lens 410 and the second flexible cover lens 560. The upper protective film 105 is disposed on top of the first flexible cover lens 410, though it is to be understood that the upper protective film 105 is optional and may be omitted from the display device 600.

The first flexible cover lens 410 includes the first hard coat layer 120 and the first substrate 130. The second flexible cover lens 560 includes the second hard coat layer 170 and the second substrate 180. In one or more examples, the sacrificial adhesion layer 150 is disposed between the first substrate 130 of the first flexible cover lens 410 and the second hard coat layer 170 of the second flexible cover lens 560. The display device 600 also includes the adhesive layer 205 disposed between the display structure 210 and the second substrate 180 of the second flexible cover lens 560.

In some embodiments, the first hard coat layer 120 and the first substrate 130 are bonded together by the adhesive layer 125 disposed therebetween, and/or the second hard coat layer 170 and the second substrate 180 are bonded together by the adhesive layer 175 disposed therebetween. Alternatively, in one or more embodiments, each of the components of the first flexible cover lens 410 and the second flexible cover lens 560 can independently be adhered, bonded, or otherwise held together without the use of an adhesive. As such, any or all of the adhesive layers 125 and 175 may be excluded and the neighboring components or layers are held together with inherent bonding forces.

Figure 7:
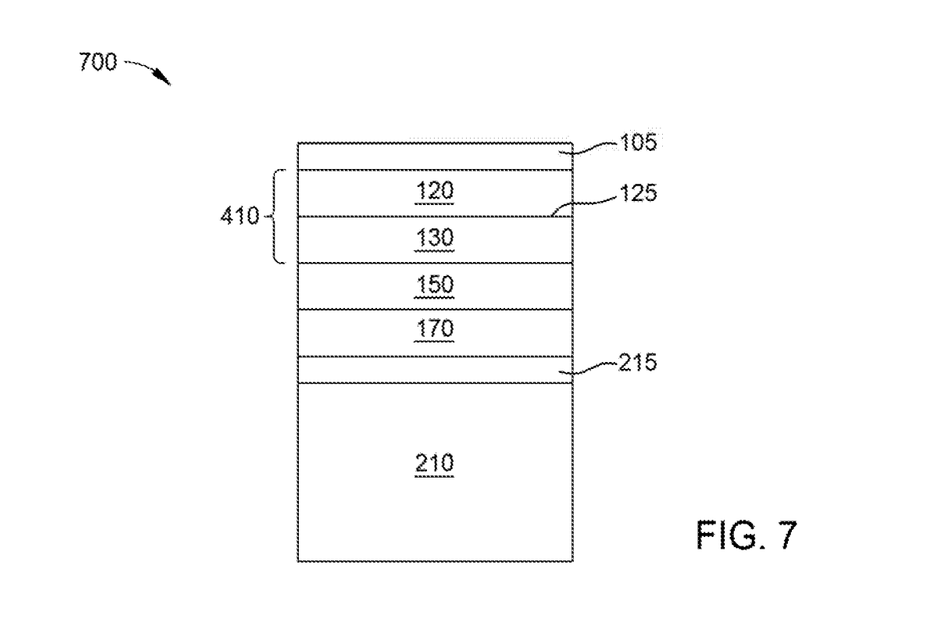
FIG. 7 depicts a schematic, cross-sectional view of another display device according to one or more embodiments described herein.
Figure 8:
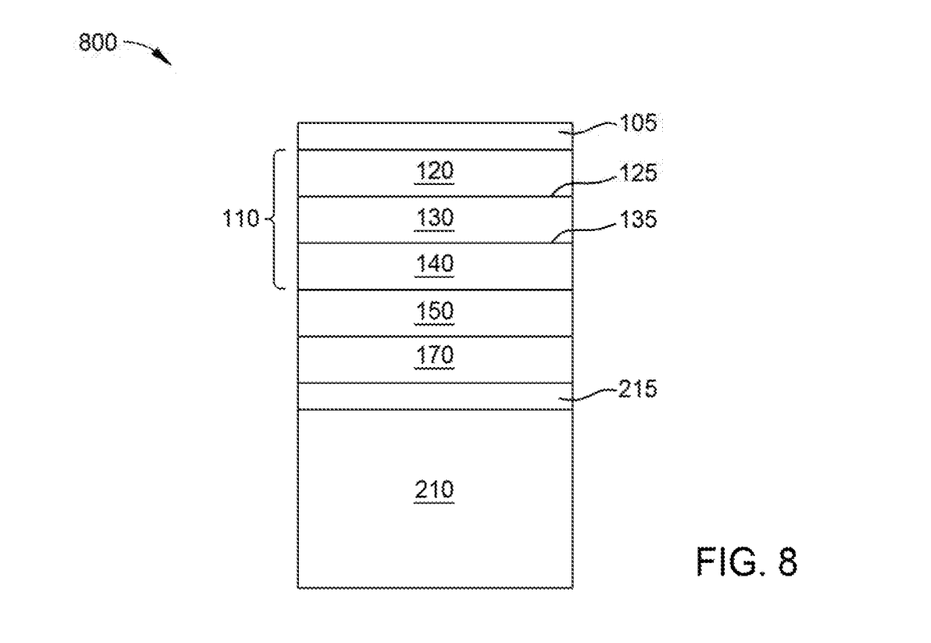
FIG. 8 depicts a schematic, cross-sectional view of another display device according to one or more embodiments described herein.
Figure 9:
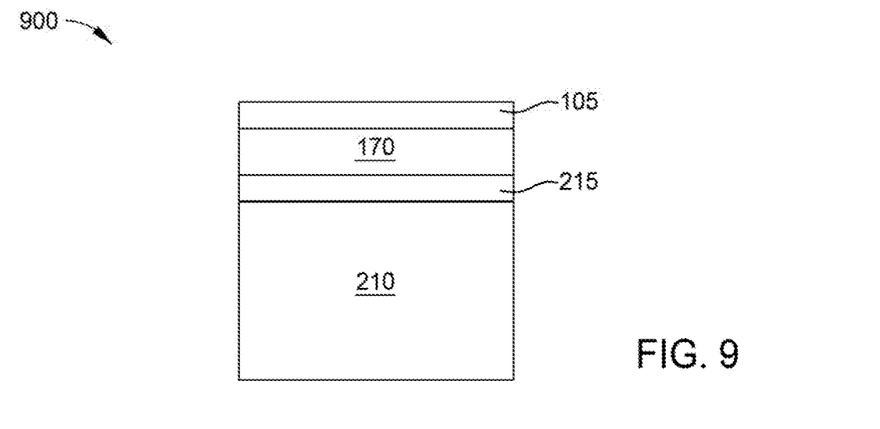
FIG. 9 depicts a schematic, cross-sectional view of another display device according to one or more embodiments described herein.

FIGS. 7-9 depict schematic, cross-sectional views of display devices 700, 800, 900 which can include optional intermediate layer 215, as described and discussed in one or more embodiments herein. In some embodiments, the intermediate layer 215 is present in the display devices 700, 800, 900, and in other embodiments, the intermediate layer 215 is excluded in the display devices 700, 800, 900, as further discussed below.

FIG. 7 depicts a schematic, cross-sectional view of the display device 700 according to one or more embodiments described herein. The display device 700 includes the first flexible cover lens 410, the second hard coat layer 170, and the sacrificial adhesion layer 150 disposed between the first flexible cover lens 410 and the second hard coat layer 170. The first flexible cover lens 410 includes the first hard coat layer 120 and the first substrate 130. The sacrificial adhesion layer 150 is disposed between the first substrate 130 of the first flexible cover lens 410 and the second hard coat layer 170.

FIG. 8 depicts a schematic, cross-sectional view of the display device 800 according to one or more embodiments described herein. The display device 800 includes the first flexible cover lens 110, the second hard coat layer 170, and the sacrificial adhesion layer 150 disposed between the first flexible cover lens 110 and the second hard coat layer 170. The first flexible cover lens 110 includes the first substrate 130 disposed between the first hard coat layer 120 and the first impact absorption layer 140. The sacrificial adhesion layer 150 is disposed between the first impact absorption layer 140 of the first flexible cover lens 110 and the second hard coat layer 170.

Referring to FIGS. 7 and 8, each of the display devices 700, 800 can optionally include the adhesives layer 125, 135, as described and discussed in one or more embodiments herein. For example, the first hard coat layer 120 and the first substrate 130 are bonded together by the adhesive layer 125 disposed therebetween within the display devices 700, 800 (FIGS. 7 and 8). Also, the first substrate 130 and the first impact absorption layer 140 are bonded together by the adhesive layer 135 disposed therebetween within the display device 800 (FIG. 8). Alternatively, in one or more embodiments, each of the components of the first flexible cover lens 110, 410 can independently be adhered, bonded, or otherwise held together without the use of an adhesive. As such, any or all of the adhesive layers 125, 135 may be excluded and the neighboring components or layers are held together with inherent bonding forces.

FIG. 9 depicts a schematic, cross-sectional view of the display device 900 containing the second hard coat layer 170, according to one or more embodiments described herein. Referring to FIGS. 7-9, each of the display devices 700, 800, 900 can optionally include the upper protective film 105, as described and discussed in one or more embodiments herein. The upper protective film 105 can be disposed on the first hard coat layer 120 in display devices 700, 800, as shown in FIGS. 7 and 8, or the upper protective film 105 can be disposed on the second hard coat layer 170 in display device 900, as shown in FIG. 9.

Also referring to FIGS. 7-9, each of the display devices 700, 800, 900 can optionally include one or more intermediate layers 215, as described and discussed in one or more embodiments herein. The intermediate layer 215 can be disposed between the second hard coat layer 170 and the display structure 210. In one or more embodiments, the intermediate layer 215 can be formed, deposited, placed, or otherwise disposed on the display structure 210 and the second hard coat layer 170 is formed, deposited, placed, adhered, or otherwise disposed on the intermediate layer 215. In some embodiments, the intermediate layer 215 can be or include one or more adhesive layers, such as the adhesive layer 205 described and discussed above. In other embodiments, the intermediate layer 215 can be or include one or more layers, such as a planarization layer, a high surface energy layer (e.g., hydrophilic properties), an encapsulation layer, a moisture and/or water vapor barrier layer, portions of layers thereof, or combinations thereof. In other embodiments, not shown, the intermediate layer 215 is not included in the display device 700, 800, 900 and the second hard coat layer 170 is formed, deposited, placed, or otherwise disposed on the display structure 210.

Figure 10:
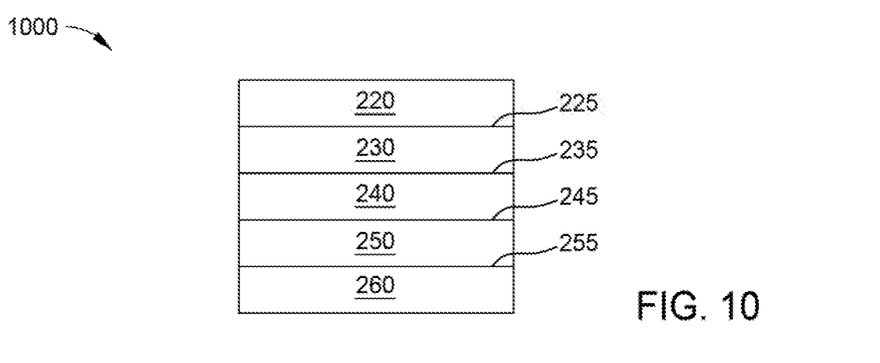
FIG. 10 depicts a schematic, cross-sectional view of a display structure according to one or more embodiments described herein.

FIG. 10 shows a schematic, cross-sectional view of a display structure 1000 that can be used as the display structure 210 contained in the display devices 200, 300, 400, 500, 600, 700, 800, 900 (FIGS. 2-9), according to one or more embodiments described herein. The display structure 210, 1000 can be flexible or rigid display or other device and can be contained within a monitor, a display, a phone (e.g., mobile or cellular phone), a computer or laptop, a tablet, a watch, or other electronic device. In one or more examples, the display structure 1000 includes a contrast enhancing layer or a polarizer layer 220, a touch panel 230, a display layer 240, a substrate 250, and a backing film 260. The polarizer layer 220 is or includes a multi-function film layer containing a polarizer film. The polarizer layer 220 is used to reduce unwanted reflections due to the reflective metal that makes up the electrode lines or metallic structures within the display structure 1000. The polarizer layer 220 can include a quarter-wave retarder and a linear polarizer formed from flexible lens film with a thickness of less than 0.2 mm.

The touch panel 230 can include a touch sensor IC board and a touch sensor (not shown). In one or more examples, the touch sensor IC board is a flexible and metal based printed circuit board. The display layer 240 can be or include one or more light emitting diode (LED) displays, one or more liquid crystal displays (LCDs), or other suitable display devices. In some examples, the display layer 240 is an organic light emitting diode (OLED) display. In one or more examples, the display layer 240 may include a thin film encapsulation (TFE), an organic emitting layer, a driver IC board, and a thin film transistor (TFT).

The substrate 250 is typically a flexible plastic or polymeric substrate. The substrate 250 can be transparent and/or colorless and in some examples, can be conductive. The substrate 250 can be or include one or more polyimide materials, polyester terephthalates, polyether ether ketones, transparent conductive polyesters, polycarbonates, polyaryletherketones, or any combination thereof. The backing film 260 can be or include one or more heat sink layers and/or one or more protective barrier layers.

Each of the components of the display structure 210 can be adhered, bonded, or otherwise held together by one or more adhesives. For example, the polarizer layer 220 and the touch panel 230 are bonded together by an adhesive layer 225 disposed therebetween. The touch panel 230 and the display layer 240 are bonded together by an adhesive layer 235 disposed therebetween. The display layer 240 and the substrate 250 are bonded together by an adhesive layer 245 disposed therebetween. The substrate 250 and the backing film 260 are bonded together by an adhesive layer 255 disposed therebetween. Each of the adhesive layers 225, 235, 245, 255 can independently be or include one or more OCA. In one or more examples, each of the adhesive layers 225, 235, 245, 255 is applied as a liquid-based adhesive which dries and bonds the two adjacent surfaces together. In some examples, each of the adhesive layers 225, 235, 245, 255 is OCA two-sided tape that bonds the two adjacent surfaces together. In other embodiments, each of the adhesive layers 225, 235, 245, 255 is independently not disposed between their respective neighboring layers which are held together by other bonding ways. For example, any of the layers or components within the display structure 210 can be deposited or otherwise formed onto the neighboring layer or component.

The flexible cover lens assembly 100, the display devices 200, 300, 400, 500, 600, 700, 800, 900, the display structure 210, and/or any layers or films thereof, can be manufactured using chemical vapor deposition (CVD), plasma-enhanced CVD (PE-CVD), atomic layer deposition (ALD), plasma-enhanced ALD (PE-ALD), physical vapor deposition (PVD) or sputtering, photo-lithography, etching, other film coating and curing processes, and/or other such suitable manufacturing processes. Suitable manufacturing devices may be purchased from Applied Materials, Inc. of Santa Clara, Calif.

The flexible cover lens and the flexible cover lens assemblies discussed and described herein may be used in any display device. The flexible cover lens and the flexible cover lens assemblies have strong strength, flexibility, elasticity, optical transmission, wear resistance, and/or thermostability. By utilizing a sacrificial adhesion layer containing degradable optically clear adhesive between a first flexible cover lens and a second flexible cover lens, or between a first flexible cover lens and a display structure or display device, if damage occurs, the first flexible cover lens can easily be removed (and replaced with a new cover lens) without damage to the underlying structures or devices.

In one or more embodiments, although flexibility requirements are dependent on specific foldable display design and product configurations, in general, the foldable cover lens, as described and discussed herein, have enough flexibility to sustain repeated bend cycles, with each cycle folding the flexible cover lens to a radius of curvature of 5 mm or less. In terms of critical strain, the flexibility of the cover lens can be indicated by the critical strain the cover lens is able to withstand, with greater than 1% critical strain (in tensile or compressive bend stress).

Embodiments of the present disclosure further relate to any one or more of the following paragraphs 1-29:

1. A cover lens assembly, comprising: a first flexible cover lens, comprising: a first hard coat layer comprising a hardness in a range from about 4 H to about 9 H; and a first substrate; a second flexible cover lens, comprising: a second hard coat layer comprising a hardness in a range from about 2 H to about 9 H; a sacrificial adhesion layer disposed between the first flexible cover lens and the second flexible cover lens, wherein the first substrate is disposed between the first hard coat layer and the sacrificial adhesion layer.

2. A cover lens assembly, comprising: a first flexible cover lens, comprising: a first hard coat layer comprising a hardness in a range from about 4 H to about 9 H; a first impact absorption layer; and a first substrate disposed between the first hard coat layer and the first impact absorption layer; a second flexible cover lens, comprising: a second hard coat layer comprising a hardness in a range from about 2 H to about 9 H; a second impact absorption layer; and a second substrate disposed between the second hard coat layer and the second impact absorption layer; and a sacrificial adhesion layer disposed between the first impact absorption layer and the second hard coat layer.

3. A cover lens assembly, comprising: a cover lens, comprising: a hard coat layer comprising a hardness in a range from about 4 H to about 9 H and a thickness in a range from about 0.1 μm to about 40 μm; and a substrate comprising a thickness in a range from about 5 μm to about 200 μm; and a sacrificial adhesion layer disposed on a lower surface of the cover lens.

4. The cover lens assembly of paragraph 3, wherein the cover lens further comprises an impact absorption layer comprising a thickness in a range from about 5 μm to about 120 μm, and wherein the substrate is disposed between the hard coat layer and the impact absorption layer.

5. A display device, comprising: a first flexible cover lens, comprising: a first hard coat layer comprising a hardness in a range from about 4 H to about 9 H; and a first substrate; a second flexible cover lens, comprising: a second hard coat layer comprising a hardness in a range from about 2 H to about 9 H; a sacrificial adhesion layer disposed between the first flexible cover lens and the second flexible cover lens, wherein the first substrate is disposed between the first hard coat layer and the sacrificial adhesion layer; a display structure; and an adhesive layer disposed between the second flexible cover lens and the display structure, wherein the sacrificial adhesion layer has a different composition than the adhesive layer.

6. A display device, comprising: a first flexible cover lens, comprising: a first hard coat layer comprising a hardness in a range from about 4 H to about 9 H; a first impact absorption layer; and a first substrate disposed between the first hard coat layer and the first impact absorption layer; a second flexible cover lens, comprising: a second hard coat layer comprising a hardness in a range from about 2 H to about 9 H; a second impact absorption layer; and a second substrate disposed between the second hard coat layer and the second impact absorption layer; and a sacrificial adhesion layer disposed between the first flexible cover lens and the second flexible cover lens; a display structure; and an adhesive layer disposed between the second flexible cover lens and the display structure, wherein the sacrificial adhesion layer has a different composition than the adhesive layer.

7. The display device of paragraph 5 or 6, wherein the display structure comprises an OLED display or an LCD display.

8. The cover lens assembly or the display device according to any one of paragraphs 1-7, wherein the first flexible cover lens further comprises a first impact absorption layer, and wherein the first substrate is disposed between the first hard coat layer and the first impact absorption layer.

9. The cover lens assembly or the display device according to any one of paragraphs 1-8, wherein the second flexible cover lens further comprises a second impact absorption layer, and wherein the second hard coat layer is disposed between the sacrificial adhesion layer and the second impact absorption layer.

10. The cover lens assembly or the display device according to any one of paragraphs 1-9, wherein the second flexible cover lens further comprises a second impact absorption layer, and wherein the second hard coat layer is disposed between the sacrificial adhesion layer and the second impact absorption layer.

11. The cover lens assembly or the display device according to any one of paragraphs 1-10, wherein the second flexible cover lens further comprises a second substrate, and wherein the second hard coat layer is disposed between the sacrificial adhesion layer and the second substrate.

12. The cover lens assembly or the display device according to any one of paragraphs 1-11, wherein the second flexible cover lens further comprises: a second impact absorption layer; and a second substrate disposed between the second hard coat layer and the second impact absorption layer.

13. The cover lens assembly or the display device according to any one of paragraphs 1-12, wherein the sacrificial adhesion layer comprises a polymeric or oligomeric material selected from the group consisting of an acrylate, a silicone, a thermoplastic adhesive, an elastomeric adhesive, and combinations thereof.

14. The cover lens assembly or the display device according to any one of paragraphs 1-13, wherein the sacrificial adhesion layer is degradable at a temperature of about 60° C. to about 120° C.

15. The cover lens assembly or the display device according to any one of paragraphs 1-14, wherein the sacrificial adhesion layer is degradable when exposed to ultraviolet light having a wavelength of about 350 nm to about 375 nm for a period of about 0.5 seconds to about 30 seconds.

16. The cover lens assembly or the display device according to any one of paragraphs 1-15, wherein each of the first hard coat layer and the second hard coat layer independently comprises a material selected from the group consisting of silicon oxide, silicon nitride, silicon oxynitride, radiation curable acrylate, aliphatic urethane acrylate, copolymer thereof, elastomer thereof, and any combination thereof.

17. The cover lens assembly or the display device according to any one of paragraphs 1-16, wherein the first hard coat layer and the second hard coat layer independently comprises a hardness from about 6 H to about 9 H.

18. The cover lens assembly or the display device according to any one of paragraphs 1-17, wherein each of the first hard coat layer and the first impact absorption layer is independently adhered to the first substrate by an adhesive different than the sacrificial adhesion layer.

19. The cover lens assembly or the display device according to any one of paragraphs 1-18, wherein each of the second hard coat layer and the second impact absorption layer is independently adhered to the second substrate by an adhesive different than the sacrificial adhesion layer.

20. The cover lens assembly or the display device according to any one of paragraphs 1-19, wherein each of the first hard coat layer and the second hard coat layer independently comprises a material selected from the group consisting of silicon oxide, silicon nitride, silicon oxynitride, radiation curable acrylate, aliphatic urethane acrylate, copolymer thereof, elastomer thereof, and any combination thereof.

21. The cover lens assembly or the display device according to any one of paragraphs 1-20, wherein each of the first substrate and the second substrate independently has a thickness in a range from about 5 μm to about 200 μm.

22. The cover lens assembly or the display device according to any one of paragraphs 1-21, wherein each of the first substrate and the second substrate independently comprises a material selected from the group consisting of polyethylene terephthalate, triacetylcellulose, polycarbonate, polyimide, polyimide, copolymers thereof, elastomers thereof, and any combination thereof.

23. The cover lens assembly or the display device according to any one of paragraphs 1-22, wherein each of the first impact absorption layer and the second impact absorption layer independently comprises a material selected from the group consisting of ether urethane, ester urethane, aliphatic urethane, aliphatic polyurethane, aliphatic polyester urethane, polysulfide thermoset, copolymers thereof, elastomers thereof, and any combination thereof.

24. The cover lens assembly or the display device according to any one of paragraphs 1-23, wherein each of the first hard coat layer and the second hard coat layer independently has a thickness in a range from about 0.1 μm to about 40 μm.

25. The cover lens assembly or the display device according to any one of paragraphs 1-24, wherein each of the first impact absorption layer and the second impact absorption layer independently has a thickness in a range from about 5 μm to about 120 μm.

26. The cover lens assembly or the display device according to any one of paragraphs 1-25, wherein each of the first hard coat layer and the second hard coat layer independently has a thickness in a range from about 0.1 μm to about 40 μm.

27. The cover lens assembly or the display device according to any one of paragraphs 1-26, wherein each of the first substrate and the second substrate independently has a thickness in a range from about 5 μm to about 200 μm.

28. The cover lens assembly or the display device according to any one of paragraphs 1-27, wherein each of the first impact absorption layer and the second impact absorption layer independently has a thickness in a range from about 5 μm to about 120 μm.

29. A display device comprising the cover lens assembly according to any one of paragraphs 1-28.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise whenever a composition, an element or a group of elements is preceded with the transitional phrase "comprising", it is understood that we also contemplate the same composition or group of elements with transitional phrases "consisting essentially of," "consisting of", "selected from the group of consisting of," or "is" preceding the recitation of the composition, element, or elements and vice versa.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:

1. A cover lens assembly, comprising:
    a first flexible cover lens, comprising:
        a first hard coat layer comprising one or more of silicon nitride, silicon oxide, and silicon oxynitride, and having a hardness in a range from about 4H to about 9H; and
        a first substrate containing the first hard coat layer formed directly onto the first substrate by a first vapor deposition process;
        wherein the first flexible cover lens has a bending inside radius of curvature of about 1 mm to about 5 mm;
    a second flexible cover lens, comprising:
        a second hard coat layer comprising a hardness in a range from about 2H to about 9H; and
        a second substrate containing the second hard coat layer formed directly onto the second substrate by a second vapor deposition process;
        wherein the second flexible cover lens has a bending inside radius of curvature of about 1 mm to about 5 mm;
    a sacrificial adhesion layer disposed between the first flexible cover lens and the second flexible cover lens, wherein the first substrate is disposed between the first hard coat layer and the sacrificial adhesion layer.

2. The cover lens assembly of claim 1, wherein the first flexible cover lens further comprises a first impact absorption layer, and wherein the first substrate is disposed between the first hard coat layer and the first impact absorption layer.

3. The cover lens assembly of claim 2, wherein the second flexible cover lens further comprises a second impact absorption layer, and wherein the second hard coat layer is disposed between the sacrificial adhesion layer and the second impact absorption layer.

4. The cover lens assembly of claim 1, wherein the second flexible cover lens further comprises a second impact absorption layer, and wherein the second hard coat layer is disposed between the sacrificial adhesion layer and the second impact absorption layer.

5. The cover lens assembly of claim 1, wherein the second hard coat layer is disposed between the sacrificial adhesion layer and the second substrate.

6. The cover lens assembly of claim 1, wherein the second flexible cover lens further comprises:
    a second impact absorption layer; and
    the second substrate disposed between the second hard coat layer and the second impact absorption layer.

7. The cover lens assembly of claim 1, wherein the sacrificial adhesion layer comprises a polymeric or oligomeric material selected from the group consisting of an acrylate, a silicone, a thermoplastic adhesive, an elastomeric adhesive, and combinations thereof.

8. The cover lens assembly of claim 1, wherein the first hard coat layer and the second hard coat layer independently comprises a hardness from about 6H to about 9H.

9. A cover lens assembly, comprising:
    a first flexible cover lens, comprising:
        a first hard coat layer comprising one or more of silicon nitride, silicon oxide, and silicon oxynitride, and having a hardness in a range from about 4H to about 9H;
        a first impact absorption layer; and
        a first substrate disposed between the first hard coat layer and the first impact absorption layer;
        wherein the first hard coat layer is formed directly onto the first substrate by a first vapor deposition process; and
        wherein the first flexible cover lens has a bending inside radius of curvature of about 1 mm to about 5 mm;
    a second flexible cover lens, comprising:
        a second hard coat layer comprising one or more of silicon nitride, silicon oxide, and silicon oxynitride, and having a hardness in a range from about 2H to about 9H;
        a second impact absorption layer; and
        a second substrate disposed between the second hard coat layer and the second impact absorption layer; and
        wherein the second hard coat layer is formed directly onto the second substrate by a second vapor deposition process; and
        wherein the second flexible cover lens has a bending inside radius of curvature of about 1 mm to about 5 mm; and
    a sacrificial adhesion layer disposed between the first impact absorption layer and the second hard coat layer.

10. The cover lens assembly of claim 9, wherein each of the first hard coat layer and the first impact absorption layer is independently adhered to the first substrate by an adhesive different than the sacrificial adhesion layer.

11. The cover lens assembly of claim 9, wherein the second impact absorption layer is adhered to the second substrate by an adhesive different than the sacrificial adhesion layer.

12. The cover lens assembly of claim 9, wherein each of the first substrate and the second substrate independently has a thickness in a range from about 5 μm to about 200 μm.

13. The cover lens assembly of claim 12, wherein each of the first substrate and the second substrate independently comprises a material selected from the group consisting of polyethylene terephthalate, triacetylcellulose, polycarbonate, polyimide, polyamide, copolymers thereof, elastomers thereof, and any combination thereof.

14. The cover lens assembly of claim 9, wherein each of the first impact absorption layer and the second impact absorption layer independently comprises a material selected from the group consisting of ether urethane, ester urethane, aliphatic urethane, aliphatic polyurethane, aliphatic polyester urethane, polysulfide thermoset, copolymers thereof, elastomers thereof, and any combination thereof.

15. The cover lens assembly of claim 9, wherein each of the first hard coat layer and the second hard coat layer independently has a thickness in a range from about 0.1 μm to about 40 μm.

16. The cover lens assembly of claim 9, wherein each of the first impact absorption layer and the second impact absorption layer independently has a thickness in a range from about 5 μm to about 120 μm.

17. A cover lens assembly, comprising:
a flexible cover lens, comprising:
a hard coat layer comprising one or more of silicon nitride, silicon oxide, and silicon oxynitride, and having a hardness in a range from about 4H to about 9H and a thickness in a range from about 0.1 μm to about 40 μm; and
a substrate comprising a thickness in a range from about 5 μm to about 200 μm;
wherein the first hard coat layer is formed directly onto the first substrate by a first vapor deposition process; and
wherein the flexible cover lens has a bending inside radius of curvature of about 1 mm to about 5 mm; and
a sacrificial adhesion layer disposed on a lower surface of the cover lens.

18. The cover lens assembly of claim 17, wherein the cover lens further comprises an impact absorption layer comprising a thickness in a range from about 5 μm to about 120 μm, and wherein the substrate is disposed between the hard coat layer and the impact absorption layer.

19. A display device, comprising:
a first flexible cover lens, comprising:
a first hard coat layer comprising one or more of silicon nitride, silicon oxide, and silicon oxynitride, and having a hardness in a range from about 4H to about 9H; and
a first substrate containing the first hard coat layer formed directly onto the first substrate by a first vapor deposition process;
wherein the first flexible cover lens has a bending inside radius of curvature of about 1 mm to about 5 mm;
a second flexible cover lens, comprising:
a second hard coat layer comprising one or more of silicon nitride, silicon oxide, and silicon oxynitride, and having a hardness in a range from about 2H to about 9H; and
a second substrate containing the second hard coat layer formed directly onto the second substrate by a second vapor deposition process;
wherein the second flexible cover lens has a bending inside radius of curvature of about 1 mm to about 5 mm;
a sacrificial adhesion layer disposed between the first flexible cover lens and the second flexible cover lens, wherein the first substrate is disposed between the first hard coat layer and the sacrificial adhesion layer, and wherein the sacrificial adhesion layer is degradable by UV light;
a display structure; and
an adhesive layer disposed between the second flexible cover lens and the display structure, wherein the sacrificial adhesion layer has a different composition than the adhesive layer.

20. The display device of claim 19, wherein the display structure comprises an OLED display or an LCD display.

21. The display device of claim 19, wherein the sacrificial adhesion layer comprises a polymeric or oligomeric material selected from the group consisting of an acrylate, a silicone, a thermoplastic adhesive, an elastomeric adhesive, and combinations thereof.

22. The display device of claim 19, wherein the sacrificial adhesion layer is degradable when exposed to ultraviolet light having a wavelength of about 350 nm to about 375 nm for a period of about 0.5 seconds to about 30 seconds.

23. A display device, comprising:
a first flexible cover lens, comprising:
a first hard coat layer comprising one or more of silicon nitride, silicon oxide, and silicon oxynitride, and having a hardness in a range from about 4H to about 9H;
a first impact absorption layer; and
a first substrate disposed between the first hard coat layer and the first impact absorption layer;
wherein the first hard coat layer is formed directly onto the first substrate by a first vapor deposition process; and
wherein the first flexible cover lens has a bending inside radius of curvature of about 1 mm to about 5 mm;
a second flexible cover lens, comprising:
a second hard coat layer comprising one or more of silicon nitride, silicon oxide, and silicon oxynitride, and having a hardness in a range from about 2H to about 9H;
a second impact absorption layer; and
a second substrate disposed between the second hard coat layer and the second impact absorption layer;
wherein the second hard coat layer is formed directly onto the second substrate by a second vapor deposition process; and
wherein the second flexible cover lens has a bending inside radius of curvature of about 1 mm to about 5 mm; and
a sacrificial adhesion layer disposed between the first flexible cover lens and the second flexible cover lens;
a display structure; and
an adhesive layer disposed between the second flexible cover lens and the display structure, wherein the sacrificial adhesion layer has a different composition than the adhesive layer.

24. The display device of claim 23, wherein each of the first hard coat layer and the second hard coat layer independently has a thickness in a range from about 0.1 μm to about 40 μm, wherein each of the first substrate and the second substrate independently has a thickness in a range from about 5 μm to about 200 μm, and wherein each of the first impact absorption layer and the second impact absorption layer independently has a thickness in a range from about 5 μm to about 120 μm.

25. The display device of claim 23, wherein the display structure comprises an OLED display or an LCD display.

26. The cover lens assembly of claim 1, wherein the sacrificial adhesion layer is degradable by UV light.

* * * * *